MASKING TECHNIQUE FOR SELECTIVE ETCHING

Francis Hugle
INVENTOR.

MASKING TECHNIQUE FOR SELECTIVE ETCHING

Filed July 24, 1967 3 Sheets-Sheet 2

INVENTOR.

MASKING TECHNIQUE FOR SELECTIVE ETCHING

Filed July 24, 1967 3 Sheets-Sheet 3

INVENTOR.

United States Patent Office 3,574,014

Patented Apr. 6, 1971

3,574,014

MASKING TECHNIQUE FOR SELECTIVE ETCHING

Frances Hugle, Santa Clara, Calif., assignor to Frances Hugle, as trustee of Frances Hugle trust Filed July 24, 1967, Ser. No. 655,456
Int. Cl. H01l 7/44, 7/50
U.S. Cl. 156—17 7 Claims

ABSTRACT OF THE DISCLOSURE

A process for forming a pattern in a dielectric layer by depositing the layer upon a semiconductor at elevated temperature from a gas, depositing a layer of metal over that by changing the gas while keeping the work in the same chamber, removing the layer of metal by a beam of energy (such as an electron or a laser beam) where the dielectric layer is to be formed into a pattern, and etching the dielectric layer by an etch that is effective upon that layer but not effective upon the layer of metal.

Figure 1:
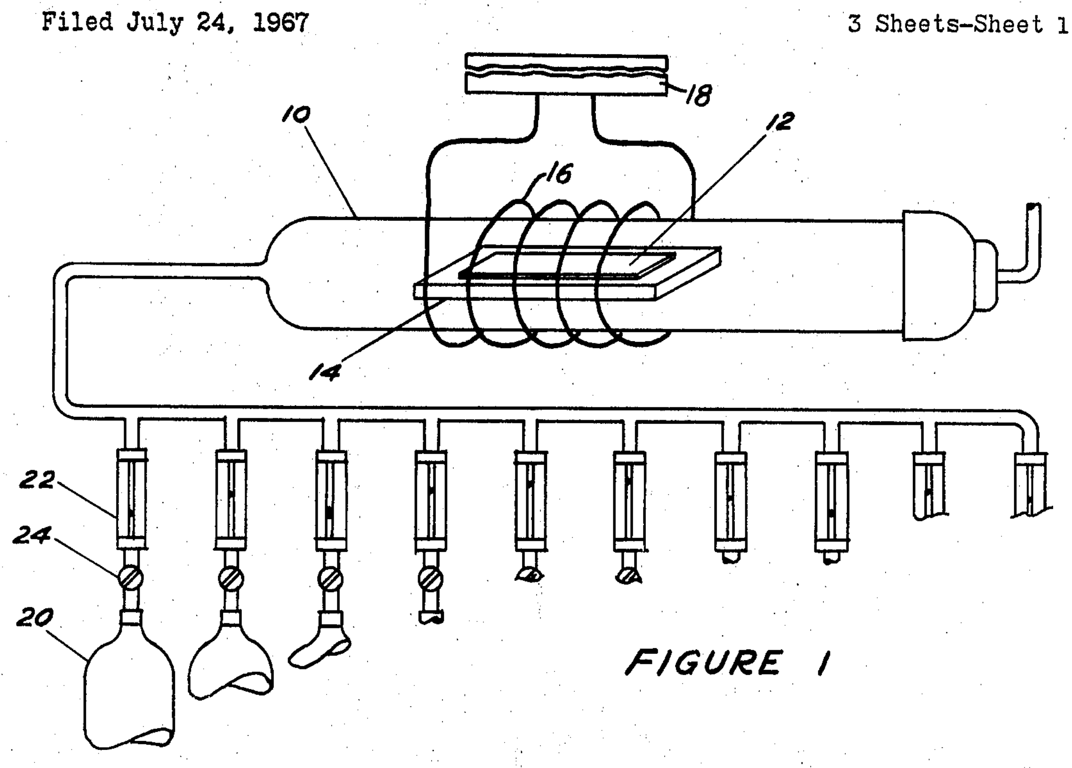

This invention relates to a method of selective etching of very fine patterns using a mask which is free of pin holes.

In the manufacture of electronic components and, more especially, in the manufacture of semiconductor components and complex combinations of semiconductors such as integrated circuits it is often necessary to selectively remove sections of an insulating layer which lies over the semiconductor. This insulating layer is usually a silicon dioxide glass or other inorganic oxides or nitrides alone or in combination. The etchants are usually very reactive, containing as one component hydrofluoric acid or other strong fluorides. The patterns to be etched may be etched may be very complex and very fine-line widths of .0002 inch are not unusual.

The present technique for etching these patterns is as follows:

A photographic plate is prepared as the negative of the pattern to be etched. The part to be etched is coated with a photoresist. The photographic pattern is projected on the photoresist coated part, causing the resist, which is an organic polymer, to further polymerize in the areas that are exposed to the light. When the resist is "developed," only the areas that were illuminated remain. The part is now etched, the resist pattern protecting those areas which are not to be etched. Any defect, such as a pinhole, in the resist pattern will usually cause the finished device or circuit to fail and it is very difficult to elimnate pinholes with this technique. Under the most careful conditions the yield of small devices (200 square mils) may exceed 95%, but the yield of large circuits (1/10 square inch) is nearly zero. The defects arise in three ways.

(1) The photographic plates cannot be made perfect. Imperfections in the emulsion or dust particles on the plate during processing result in pinholes in the opaque areas and/or spots in the clear areas.

(2) The photoresist material contains particles, usually polymerized photoresist, which prevents a uniform coating and results in pinholes or spots.

(3) The part has dust particles on the surface which prevent a uniform resist coating.

To add to the difficulty, the insulating layer to be etched, if it was vacuum deposited or a thermally grown oxide, already has some pinholes as a result of the method of formation.

It is an object of this invention to eliminate pinholes from the insulating layers on semiconductor devices.

It is a further object of this invention to improve the yield of large area integrated circuits.

It is a further object of this invention to eliminate pinholes from the insulating layers on thin film circuits.

It is a further object of this invention to improve the yield of thin film circuits.

It is a further object of this invention to reduce the cost of integrated circuits.

It is a further object of this invention to obsolete the photoresist process where large area integrated circuits are concerned.

It is a further object of this invention to simplify the procedure for making integrated circuits.

Other objects and the attendant advantages of this invention will be readily appreciated as the same becomes understood by reference to the following detailed description when considered in connection with the accompanying drawings.

FIG. 1 is a schematic representation of the apparatus for depositing a metallic resist layer to replace the photoresists now used. This is similar to the epitaxial reactors commonly used in semiconductor manufacture. The apparatus consists of a chamber 10 in which the parts 12 are lain on a susceptor 14 which is induction heated by a coil 16 connected to an AC generator 18. Sources 20 of the appropriate chemicals are connected to the chamber 10 via metered gas lines 22 with valves 24.

Figure 2:
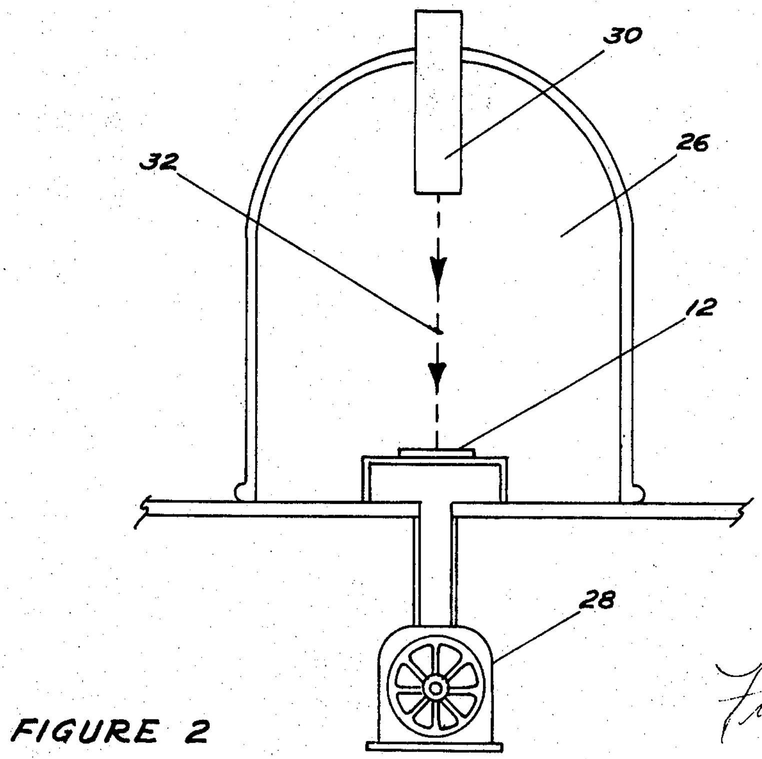

FIG. 2 is a schematic representation of the apparatus for selectively removing the metal resist in the desired pattern. It consists of a vacuum chamber 26 connected to a vacuum pump 28 with an electron beam gun 30 mounted in the vacuum chamber 26 so that the electron beam 32 can be directed at the metal resist layer on the parts 12. The mechanism for moving the parts 12 with respect to the electron beam 32 is not shown since several approaches are possible. The electron beam 32 can be moved by magnetic focusing, or the parts 12 can be mechanically moved under the beam, or both movements can be combined. In either case, the actual movement of the beam 32 with respect to the parts 12, and the starting and stopping of the beam, as well as its intensity and spot size, would normally be computer controlled. A laser may be substituted for the electron beam gun 30; the part 12 would then be hit by a laser beam instead of an electron beam 32.

The apparatus of FIG. 1 is capable of chemically depositing dielectric and metal layers of an extremely homogeneous and pin hole free structure. It is not necessary to this invention that the dielectric layers be so deposited but this will be preferable whenever possible. If the dielectric layer has been chemically deposited in the reactor then the parts are kept in place while the gas composition and temperature are adjusted to deposit the metal resist layer. After allowing the parts to cool in the reactor, they are transferred to the equipment of FIG. 2, where the electron or laser beam, under computer program control, forms the pattern in the resist by vaporizing it from the areas to be etched. When the patterning is completed, the part is etched to remove the dielectric in those areas where the metal was removed.

When the metal resist layer has served its purpose, it may be removed by an etchant that does not attack the dielectric. Metal patterns that serve as conductors for the finished device are, of course, not removed.

There are many metals that can be chemically deposited, are resistant to the fluoride etches that are used for the dielectric layer, and can be removed by etchants that do not attack the dielectric layer. The following chart shows a few of the suitable metals, some of the compounds they can be deposited from, typical deposition temperatures, carrier gases, and one or more etchants.

| Metal | Source | Tempera-ture, ° C. | Carrier gas | Etchant |
|---|---|---|---|---|
| Mo | $MoCl_5$ | 500 | $H_2$ | Hot $H_2SO_4$. |
| Al | $AlCl_3$ or $AlBr_3$ | 450-600 | $H_2$ | NaOH. |
| Au | $AuCl_3$ | 350-950 | $H_2$, $N_2$, A | Cyanide etches. |
| Si | $SiCl_4$ | 1,000-1,250 | $H_2$ | $HF+HNO_3$. |

The following example shows how this invention could be applied to MIS (metal-insulator-semiconductor) integrated circuits. It will be better understood by reference to the figures.

Figure 3:
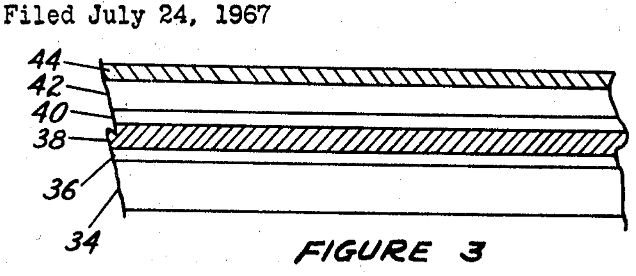
Figure 4:
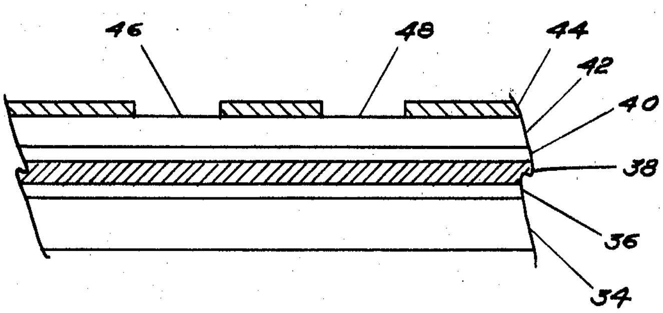
Figure 5:
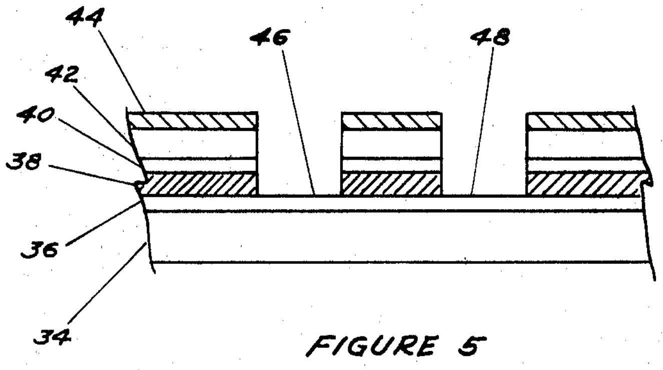
Figure 6:
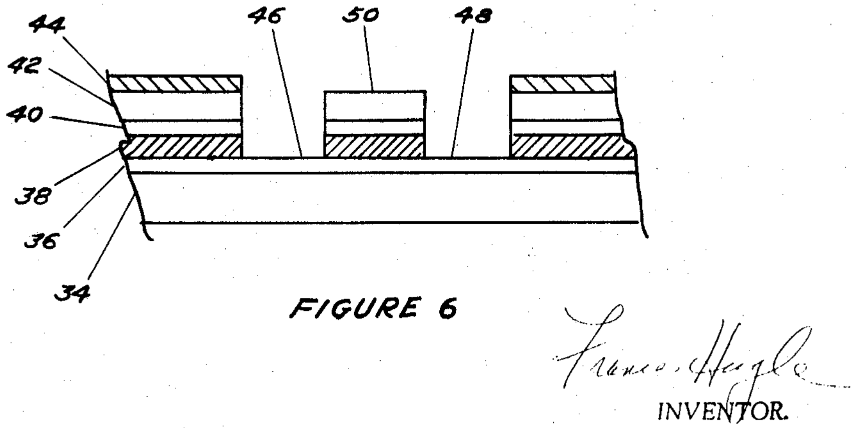
Figure 7:
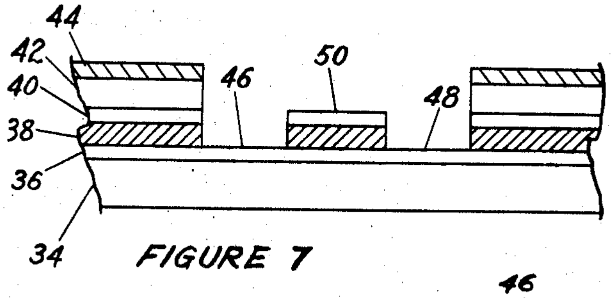
Figure 8:
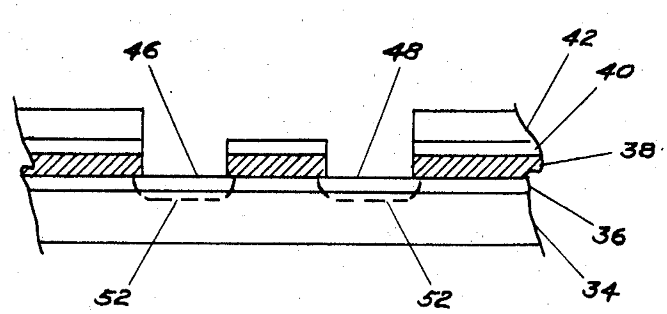
Figure 9:
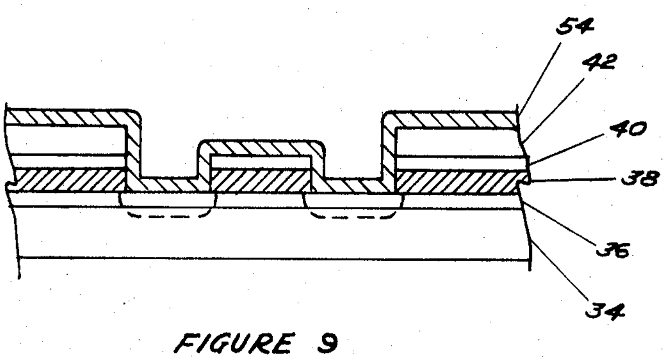
Figure 10:
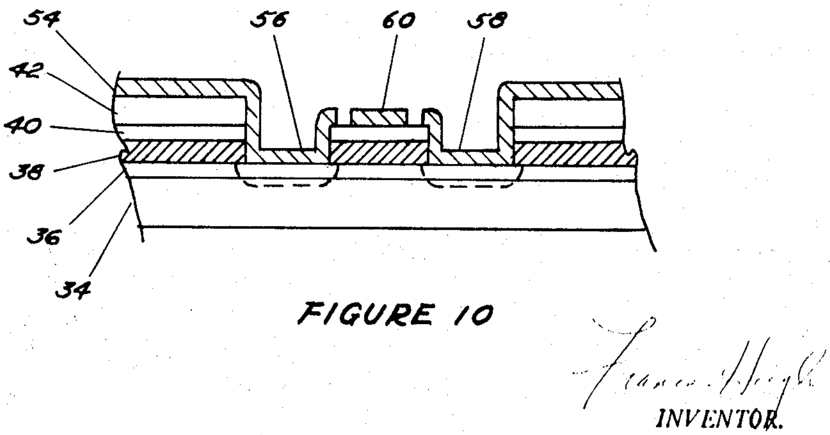

Place a high resistivity P type wafer 34 on the susceptor 14 and into the reaction chamber 10. Flow $N_2$ (nitrogen) for 5 minutes to purge the chamber 10 of air. Turn off the $N_2$ and turn on $H_2$ (hydrogen); also turn on the generator 18 and heat the wafer 34 to 1175° C. Add HCl (hydrogen chloride) to the $H_2$ stream to etch the silicon surface for 5 minutes. Turn off the HCl and turn on $SiCl_4$ (silicon tetrachloride) and $B_2H_6$ (diborane) to deposit an epitaxial layer of .5 ohm centimeter P type silicon about 2000 A. thick 36. Turn off the $SiCl_4$ and $B_2H_6$ and turn on $CO_2$ (carbon dioxide) for about 10 minutes to oxidize about 200 A. of the silicon 38. Turn off the $CO_2$ and reduce the temperature to 900° C. Turn on $SiCl_4$ and $NH_3$ (ammonia) and deposit about 2000 A. of $Si_3N_4$ 40 (silicon nitride). Turn off the $NH_3$, turn on the $CO_2$ and raise the temperature back to 1175° C. to deposit a micron of $SiO_2$ (silicon dioxide) 42. Turn off the $SiCl_4$ and $CO_2$ and introduce $MoCl_5$ (molybdenum pentachloride) to deposit ½ to 1 micron of molybdenum 44. Turn off the power and allow the wafer to cool in $N_2$. Place the cooled wafer of FIG. 3 into the vacuum chamber 26 and remove the molybdenum 44 from the source 46 and drain 48 areas with the laser or the electron beam to produce the structure of FIG. 4. Etching the wafer with a suitable fluoride etch produces the structure of FIG. 5. Return the wafer to the apparatus of FIG. 2 and with the electron or laser beam remove the molybdenum metal 44 from the gate area 50, as shown in FIG. 6. Place the wafer in a less reactive etch than previously to remove only the $SiO_2$ layer 42 from the gate area 50 as shown in FIG. 7. Now remove the rest of the metal in a hot sulphuric acid etch and place the wafer back on the susceptor 14 and into the reactive chamber 10. After purging with $N_2$, switch to $H_2$ and heat the wafer to about 1200° C. Add HCl to the gas stream to each and clean the exposed silicon surfaces, then turn off the HCl and add $PH_3$ (phosphine) to diffuse an N region into the exposed source 46 and drain 48 areas. FIG. 8 shows the PN junctions 52 formed by this diffusion. When the diffusion is complete, turn off the $PH_3$ and turn on the $MoCl_5$ to deposit a new layer of molybdenum 54 which will form the contact metallization and electrical interconnections of the finished circuit. When about 1 micron has been deposited, turn off the power and allow the wafer to cool in $N_2$. When the wafer is cool, remove it from the reaction chamber 10 and return it to the apparatus of FIG. 2. It now looks, in section, like FIG. 9. With the laser or electron beam remove unwanted metal, as shown in FIG. 10, so as to leave the source contacts 56, drain contacts 58, gate contacts 60, and interconnections between devices (not shown).

The process may be adapted to other semiconductor materials and devices as well as to many thin film circuits and the necessary modifications will be dictated by the device or circuit, and will be obvious to practitioners of the semiconductor and/or thin film arts.

Having thus described the invention, I claim:

1. The process for forming a fine line pattern in a dielectric layer upon a semiconductor, which includes the steps of;

(a) placing the seimconductor (34) in an enclosed chamber, (b) depositing a silicon nitride dielectric layer (40) upon said semiconductor by heating said semiconductor within said chamber while exposing it to a gas mixture containing nitrogen, (c) depositing a silicon dioxide dielectric layer (42) upon said nitride layer by changing the gas mixture to one containing oxygen while retaining said semiconductor in said chamber, (d) again changing the gas mixture to chemically deposit a layer of metal (44) which is a member of the group consisting of molybdenum, aluminum and gold over said silicon dioxide layer while still retaining said semiconductor in said chamber, (e) selectively removing said layer of metal according to a pattern (46, 48) by a beam of incident energy, (f) removing both said dielectric layers according to said pattern by an etch effective upon said dielectric layers but ineffective upon said layer of metal, and (g) selectively etching and diffusing into the resulting dielectric-semiconductor structure to form an electrically operative semiconductor device.

2. The process of claim 1, in which;

(a) said beam of energy is a beam of electrons.

3. The process of claim 1, in which;

(a) said beam of energy is a laser beam of light.

4. The process of claim 1, in which;

(a) said layer of metal also includes silicon.

5. The process of claim 1, which additionally includes;

(a) removing all of the layer of metal previously deposited, (b) depositing a second layer of metal upon said dielectric layer and upon said semiconductor surface as previously processed, and (c) selectively removing said second layer according to a second pattern by impinging a beam of energy thereupon in a vacuum.

6. The process of claim 1, which additionally includes;

(a) initially depositing upon said semiconductor (34) a silicon dioxide dielectric layer (38), thin with respect to the thickness of the subsequent silicon nitride and silicon dioxide layers.

7. An article made by the method of claim 1.

References Cited

UNITED STATES PATENTS

| | | | |
|---|---|---|---|
| 3,168,422 | 2/1965 | Allegretti et al. | 148—175 |
| 3,479,237 | 11/1969 | Bergh et al. | 156—11 |
| 3,243,323 | 3/1966 | Corrigan et al. | 148—175 |
| 3,391,024 | 7/1968 | Pierce | 117—217 |
| 3,364,087 | 1/1968 | Solomon et al. | 156—4 |

OTHER REFERENCES

IBM-Technical Disclosure Bulletin, vol. 7, No. 5 October 1964, p. 341, Mask for Etching SiC, by W. Liebmann.

JACOB STEINBERG, Primary Examiner

U.S. Cl. X.R.

29—580; 117—93.3, 217; 148—175